US 6,429,113 B1

(12) United States Patent
Lewis et al.

(10) Patent No.: US 6,429,113 B1
(45) Date of Patent: Aug. 6, 2002

(54) METHOD FOR CONNECTING AN ELECTRICAL DEVICE TO A CIRCUIT SUBSTRATE

(75) Inventors: Robert Lee Lewis, Apalachin; Robert David Sebesta, Endicott, both of NY (US); Daniel Martin Waits, Manassas, VA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/518,447

(22) Filed: Mar. 3, 2000

Related U.S. Application Data

(60) Continuation-in-part of application No. 08/963,051, filed on Nov. 3, 1997, now abandoned, which is a division of application No. 08/233,193, filed on Apr. 26, 1994, now Pat. No. 5,712,192.

(51) Int. Cl.[7] .............................................. H01L 21/44
(52) U.S. Cl. ...................... 438/612; 438/106; 438/125; 438/613
(58) Field of Search ................................ 438/106, 125, 438/612, 613, 614

(56) References Cited

U.S. PATENT DOCUMENTS

| 3,997,963 | A |   | 12/1976 | Riseman ..................... 437/183 |
|---|---|---|---|---|
| 4,289,846 | A |   | 9/1981 | Parks et al. .................. 437/182 |
| 4,296,456 | A | * | 10/1981 | Reid ............................ 361/771 |
| 4,430,365 | A |   | 2/1984 | Schaible et al. ............... 427/96 |
| 4,667,404 | A |   | 5/1987 | Reisman et al. ............... 29/847 |
| 4,801,067 | A |   | 1/1989 | Kondo et al. ................. 228/123 |
| 4,805,683 | A |   | 2/1989 | Magdo et al. ................. 156/643 |
| 4,816,323 | A |   | 3/1989 | Inoue .......................... 438/200 |
| 4,835,593 | A |   | 5/1989 | Arnold et al. ................ 357/71 |
| 4,875,971 | A |   | 10/1989 | Orbach et al. ............... 437/195 |
| 4,937,006 | A | * | 6/1990 | Bickford et al. ............. 228/219 |
| 4,949,224 | A |   | 8/1990 | Yamamura ................... 361/412 |
| 4,983,250 | A |   | 1/1991 | Pan ............................. 156/628 |
| 5,401,687 | A |   | 3/1995 | Cole et al. ................... 437/182 |
| 5,534,442 | A |   | 7/1996 | Parker et al. ................ 437/183 |

FOREIGN PATENT DOCUMENTS

| DE | 4101042 | 2/1992 |
|---|---|---|
| EP | 0218438 | 4/1987 |
| EP | 0499079 | 8/1992 |
| JP | 62169459 | 7/1987 |

OTHER PUBLICATIONS

International Journal of Microcircuits & Electronics Packaging, "Characteristics and Performance of PHP–92: AT&T's Triazine–Based Dielectric for Polyhic MCMs", E. Sweetman, vol. 15, No. 4, 4Q92, pp 195–204, 1992.
International Electronic Manufacturing Technology Symposium, "A Fine–Line Multilayer Substrate with Photo–Sensitive Polyimide Dielectric and Electroless Copper Plated Conductors", Ohsaka et al, 1987; Oct. 12, 1987, pp. 178–183.

(List continued on next page.)

Primary Examiner—Michael Trinh
Assistant Examiner—Christy Novacek
(74) Attorney, Agent, or Firm—James A. Lucas; Driggs, Lucas, Brubaker & Hogg Co., LPA

(57) ABSTRACT

A method of making a circuitized substrate for use in an electronic package wherein the substrate, e.g., ceramic, includes more than one conductive layer, e.g., copper, thereon separated by a suitable dielectric material, e.g., polyimide. Each layer includes its own conductive location (s) which are designed for being directly electrically connected, e.g. using solder, to respective contact sites on a semiconductor chip to form part of the final package. Significantly, the resulting package does not include interconnections between the conductive layers at the desired contact locations; these locations, as mentioned, instead being directly connected to the chip.

16 Claims, 3 Drawing Sheets

OTHER PUBLICATIONS

IEEE Transactions on Components, Hybrids and Manufacturing Technology, "Solder Connections with a Ni Barrier", Keller et al, vol. CHMT–9, No. 4, Dec. 1986, pp. 433–439.

IBM TDB, vol. 22, No. 10, Mar. 1980, "Method of Connecting Layers of Circuitry Separated by a Dielectric", A. R. Abolafia, pp. 4471–4473.

IBM TDB, vol. 25, No. 3B, Aug. 1982, "Black Chromium as a Solder Dam", M. L. Block et al, p. 1394.

IBM TDB, vol. 27, No. 3, Aug. 1984, "Contact Pads for Ceramic Integrated–Circuit Substrates", J. M. Krumpelmann et al, p. 1721.

* cited by examiner

METHOD FOR CONNECTING AN ELECTRICAL DEVICE TO A CIRCUIT SUBSTRATE

CROSS REFERENCE TO RELATED APPLICATIONS

This application is a continuation-in-part of U.S. Ser. No. 08/963,051, filed Nov. 3, 1997 abandoned, which is a divisional of U.S. Ser. No. 08/233,193, filed Apr. 26, 1994, now U.S. Pat. No. 5,712,192.

BACKGROUND OF THE INVENTION

1. Field of the Invention

The invention relates to electronic packaging, and particularly to such packaging which utilizes at least two different levels of conductive layers, e.g., signal, power and/or ground, as part thereof. Such packages are particularly adapted for use in information handling systems (computers).

2. Description of the Related Art

Typical electronic packages of the type described above include a dielectric substrate as a critical element thereof this substrate, e.g., of ceramic or a suitable polymer material such as fiberglass-reinforced epoxy resin (FR4), having the various desired conductive layers located thereon and/or therein.

Examples of various electronic packages of the type referred to herein are also described in the following identified US Letters Patents:

U.S. Pat. No. 4,430,365—Schaible et al.
U.S. Pat. No. 4,446,477—Currie et al.
U.S. Pat. No. 4,805,683—Magdo et al.
U.S. Pat. No. 4,835,593—Arnold et al.

Further attention is also directed to the following International Business Machines (IBM) Corporation Technical Disclosure Bulletins (TDBs) for descriptions of various ceramic substrates having circuitry thereon:

IBM TDB Vol. 22, No, 10, March, 1980
IBM TDB Vol. 32, No. 10A, March, 1990

In one known process for manufacturing an MCP package, which will include at least one chip electrically coupled to the circuitry thereof, the process begins with the deposition of a first layer of metal on the ceramic's top surface. This layer is initially comprised of chromium-copper-chromium (Cr—Cu—Cr) and is sputter deposited using known sputtering techniques. A layer of photoresist is then used to cover the Cr—Cu—Cr layer, this layer then subjected to a series of photolithography steps (soft bake, expose, develop and bake) to form a desired pattern of such resist on the Cr—Cu—Cr. Areas of unprotected metal in the underlying Cr—C—Cr layer are then removed using a known etching operation. The remaining protective pattern of resist is then removed (stripped) to expose the desired circuit pattern remaining on the ceramic's top surface. This pattern, understandably, includes at least one and preferably several contact locations, each of which is adapted for being electrically coupled to a respective contact site on the chip(s). In the next step in the operation, a layer of dielectric, e.g., polyimide, is then deposited over the entirety of the remaining circuit pattern, including the contact locations, such deposition referred to in the industry as blanket coating (meaning to cover the entire circuitry).

Another series of photolithography steps are performed on the polyimide to define a pattern of openings (which are referred to as "vias"), selected portions (those which have been developed) of the dielectric polyimide then being removed to thereby expose parts of the circuitry thereunder. Understandably, the aforementioned contact locations are so exposed. At this point, the polyimide is baked and raised to a high cure state. In an alternative operation, laser ablation may be used instead of the chemical processing which forms part of the described photolithography steps to effect the desired selective removal of polyimide. The top layer of chromium of the Cr—Cu—Cr layer is then removed using a known etching operation, such that the remaining exposed parts of the layer (the contact locations) are comprised of an upper portion of copper and a minute layer of chromium (which promotes adhesion of the copper-chromium to the ceramic).

In the next step of this manufacturing operation, a second layer of metal is deposited over the polyimide and the exposed conductive contact locations. A procedure known as a batch evaporation process is used, the result being that a layer comprised of chromium-copper-chromium is again formed. The aforementioned batch evaporation process is used at this stage rather than the described sputtering step because such a process has a prolonged heat cycle that serves to drive off solvents and water vapor which might remain and possibly interfere with the resulting interconnections between conductive layers. The previously described photolithography and wet processing steps are then repeated to define a second desired pattern for the second conductive layer. Final photolithography patterning followed by top chromium etch is then performed to selectively remove the chromium originally found in the top conductive layer. As in the case of the underlying first conductive layer, this second conductive layer will include at least one and preferably several contact locations for providing chip coupling.

The result of the above process is the formation of at least two conductive layers on the upper surface of the dielectric ceramic, each of these layers with at least one contact location thereon which is adapted for being electrically coupled, e.g., using solder as mentioned above, to respective contact sites on a chip which is then to be located over the exposed contact locations and coupled thereto. As further understood, these conductive layers are also separated by the dielectric layer of polyimide, which serves to electrically insulate the two as is necessary for successful operation of the package.

At least two disadvantages are associated with the above-described manufacturing process. One is that this process requires the performance of several diverse steps, requiring relatively large periods of time and the use of elaborate and expensive equipment. A second is that the process requires the formation of metal-to-metal interconnections at selected locations (those contact locations of the first layer with metal from the second conductive layer). Such interconnections are susceptible to variations in electrical resistance, which is of course highly undesirable in the manufacture of such precision-demanding products as multileveled electronic packages. To assure reliability between such interconnections to the levels demanded in this industry, special control measure and test operations are essential. This also adds to the overall costs of the final packages.

As will be described herein, the present invention describes a process for making a multilevel electronic package wherein at least two conductive layers are used, each with individual contact locations for being electrically coupled to respective contact sites on a semiconductor chip. Significantly, the contact locations of one layer are located at a greater distance (elevation) above the dielectric substrate's upper surface while still being directly electrically coupled to the respective chip contact sites. As will be further described herein, the process for manufacturing such a product is capable of being performed with fewer steps and in less time than the aforementioned process for the MCP product described above. Equally significant, this process results in a product wherein metal-to-metal interconnections between separate metal conductor levels are unnecessary, thereby overcoming the above-mentioned disadvantages associated therewith. Although the present invention is particularly adapted for the manufacture of MCP products, this is not meant to limit the invention in that the process as defined herein may be readily adapted for utilization with other types of substrate packages, including those which use known FR4 and other dielectric materials for the base substrate member.

It is believed that such an electronic package and process for manufacturing same would represent a significant advancement in the art.

BRIEF DESCRIPTION OF THE INVENTION

It is, therefore, an object of the present invention to enhance the art of electronic packages, including the processes used in this art to produce such multilevel electric packages.

It is another object of the invention to provide an electronic package which includes at least two individual conductive layers, each with respective contact locations, wherein the locations of each layer are located at a different distance from the underlying substrate's upper surface while still providing direct electrical connection to the respective contact sites on a semiconductor chip when the chip is positioned on the substrate to form part thereof.

It is yet another object of the invention to provide a process for making such an electronic package.

It is still another object of the invention to provide such a process and resulting package structure which can be produced using fewer operational steps than that as described heretofore, as well as in less time, thereby representing a cost advantage to the ultimate consumer of the package as well as to those who produce it.

In accordance with one aspect of the invention, there is provided a method for making a circuitized substrate which comprises the steps of providing a substrate having a first surface, providing a circuit pattern on this first surface which will include at least one contact location, covering the first circuit pattern with dielectric material, providing a second circuit pattern on the dielectric which will also include its own contact location which is located at a different level from the contact location(s) of the first pattern, and then removing a portion of the dielectric layer to expose the contact location of the first layer. Both contact locations, being at different levels (distances from the substrate's upper surface), are, significantly, adapted for being directly electrically connected, e.g., soldered, to respective sites on a semiconductor chip when the chip is positioned on the substrate.

In accordance with another aspect of the invention, there is provided a circuitized substrate which comprises a dielectric substrate having an upper surface, a first circuit pattern on the surface and including a first exposed contact location located a first distance from the surface, a layer of dielectric on the first pattern and including an opening therein to provide exposure for the first contact location, and a second circuit pattern on the dielectric and including a second contact location located at a second, greater distance from the surface than the first contact location of the first pattern. This second contact location is also exposed, with both exposed first and second contact locations adapted for being directly electrically coupled to the respective contact sites on a semiconductor chip.

In accordance with yet another aspect of the invention, a method is described for making a multilevel electronic package. The method comprises applying a conductive layer onto a surface of a substrate, the conductive layer having an exposed top surface. A layer of an organic dielectric is applied over the exposed top surface of the first conductive layer and is cured. A second conductive layer is formed on the cured dielectric layer at a greater distance from the surface of the substrate than the first conductive layer. At least a portion of the second conductive layer is removed to expose the dielectric layer immediately therebeneath, and the exposed dielectric layer is removed to expose a portion of the first conductive layer. One or more solder connections is formed on the exposed portion of the first conductive layer, and one or more solder connections is formed on the second conductive layer, there being no interconnection between the solder connections on the first layer and the solder connections on the second layer to form a subassembly. The solder connections on the first conduct layer of the first conductive layer and the solder connections on the second conductive layer can then be mated to a semiconductor chip, a metal clip or other electronic subassembly.

DETAILED DESCRIPTION OF THE INVENTION

For a better understanding of the present invention, together with other and further objects, advantages and capabilites thereof, reference is made to the following disclosure and appended claims in connection with the above-described drawings.

In FIGS. 1–5, there are shown various steps to manufacture a circuitized substrate in accordance with one aspect of this invention. As understood, this substrate is specifically designed for use within an electronic package structure of the type mentioned above particularly for use in information handling systems. It is well accepted in this field that such package structures must meet stringent design requirements. As defined herein, the present invention is able to do so while still assuring a final structure that can be produced with relatively fewer costs and in less time than many such package structures known in the industry.

Figure 1:
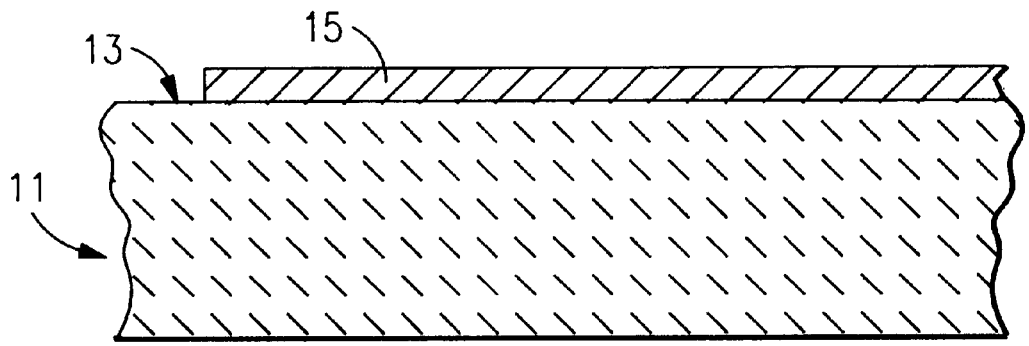
FIGS. 1–5 illustrate the various steps in the process for manufacturing a circuitized substrate in accordance with one embodiment of the invention, this substrate designed for being used in an electronic package of the type described hereinabove.

In FIG. 1, a substrate 11 is provided including at least one substantially planar upper surface 13. Substrate 11 is preferably of ceramic or alumina, but this is not meant to limit the scope of the invention in that other materials are possible. A thin conductive layer 15 is applied to surface 13, a preferred material for layer 15 being a combination of chromium, copper and chromium applied in three stages using a sputtering process. Specifically, a first layer (e.g., about 0.08 micrometers ($\mu$m) thick) of chromium is sputter-deposited using standard sputter processing known in the art. In one example of such a process, an in-line sputtering system such as the ULVAC-850 system manufactured by the Ulvac Corporation may be utilized. Further description is not believed necessary. This first chromium layer serves to promote adhesion of the following metal layer to substrate 11. A layer of copper about 4 $\mu$m thick is then sputter-deposited onto the chromium, following which a very thin covering layer of chromium, having a thickness of only about 0.08 $\mu$m is then sputter-deposited. Following subsequent processing (defined below), including partial removal, layer 15 is to serve as the first circuit pattern for the circuitized substrate of the invention.

Layer 15 is subjected to a series of photolithography steps known in the art to define a first electrical pattern, including necessary contact locations, and, possibly accompanying fine circuit lines. Such contact locations, as to be understood, will serve to eventually electrically couple this first layer to respective contact sites on an electrical device such as a semiconductor chip 17 (FIG. 6) which is to form part of the final package which utilizes the circuitized substrate formed in accordance with the teachings provided herein. During such processing, a suitable photoresist is applied (e.g., coated) onto layer 15, following which the photoresist is heated (baked), exposed (e.g., using a projection printer), developed (e.g., using a xylene containing developer), and then heated (baked) again. Selected areas (not shown in FIG. 1) of layer 15 may be removed as a result of this process, the remaining portions, understandably, forming the desired circuit pattern for this initial layer on substrate 11. Alternatively, it may be desired to retain layer 15 of substantially solid configuration, e.g., should this layer serve as a ground or power function. In the earlier described embodiment, this layer may serve as a signal layer. The preferred process for removing portions of layer 15, if this is to occur, is by etching. Whether layer 15 is to function as a signal, power or ground layer, it will still include at least one and preferably several contact locations as part thereof In one embodiment, a total of about 300 such locations were provided.

Following etching, any remaining photoresist is then removed. The result is that a desired final circuit pattern has now been provided on surface 13 of substrate 11. In one embodiment, this pattern possessed a total thickness of only about 4.0 $\mu$m.

Figure 2:
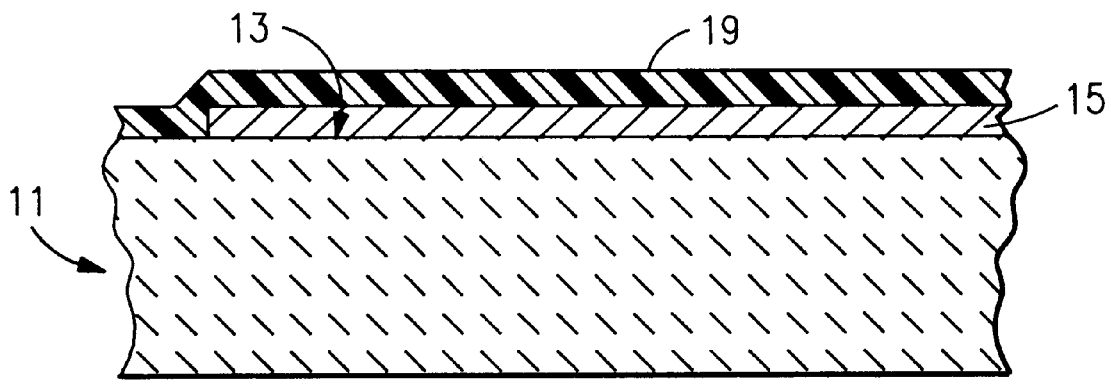

In the next step of the invention, as shown in FIG. 2, a layer of dielectric material 19, e.g., polyimide, is blanket coated onto the pattern of first layer 15. Preferably, a thickness of about 8.0 $\mu$m (after all cures) is provided, the polyimide applied using a standard coating operation. During this operation, polyimide diluted with a cosolvent is sprayed onto the parts and baked in a conveyorized oven at about 90 degrees Celsius (C) for several minutes, until the polyimide reaches what is defined as an A-stage cure. Such cure stages (e.g., A, B, C) are known in this art and further description not believed necessary. It is understood that the invention is not limited to polyimide, in that other polymers, e.g., TEFLON (a trademark of E. I. duPont deNemours Company), may be successfully used. Significantly, the coated polyimide is then baked to a high cure state, in one example, to a temperature of about 365 degrees C. High cure of the polyimide is accomplished in order to permit subsequent treatment on the polyimide as defined in greater detail below.

Figure 3:
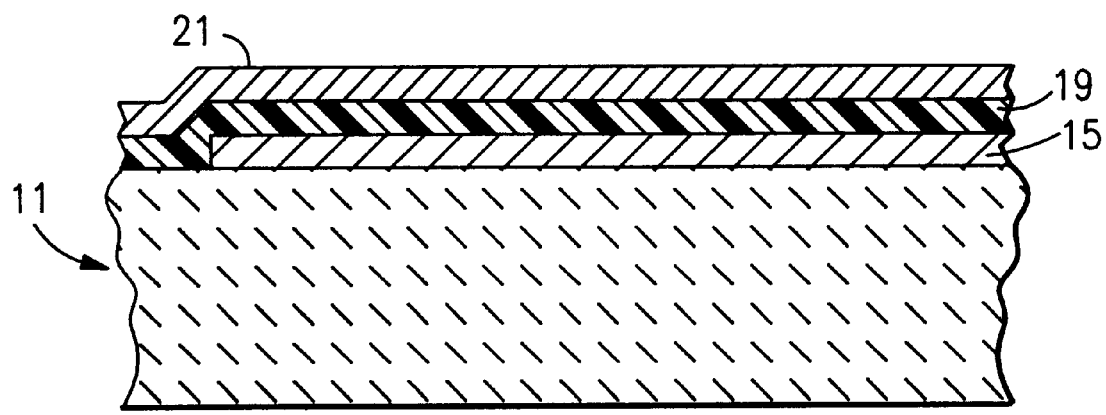

In the next step, a second layer of metal 21 is deposited onto the cured polyimide 19, this step depicted in FIG. 3. The preferred process for achieving such deposition is to use a sputtering operation as defined hereinabove. This second layer, like layer 15, is preferably a composition of chromium, copper and chromium, and is preferably deposited in the same manner and using the same equipment as was used to provide layer 15. In this second layer 21, however, about 8 $\mu$m of copper is applied. The process as defined herein is thus able to maximize use of equipment, thereby assuring cost savings in this regard. As indicated, such a sputtering operation is carried out at relatively high temperatures, e.g., at above 400 degrees C. Of significance, the underlying polyimide, being highly cured, is capable of withstanding such temperatures for the time periods utilized. Additionally, the polyimide has not been subjected to a series of wet chemical processes (as occurred in similar processing known in the industry) wherein etching typically occurred. Such etching could serve to promote water absorption in the polyimide, a hydroscopic material, resulting in outgassing of water vapor during subsequent metal deposition. The present invention eliminates this possibility.

Figure 6:
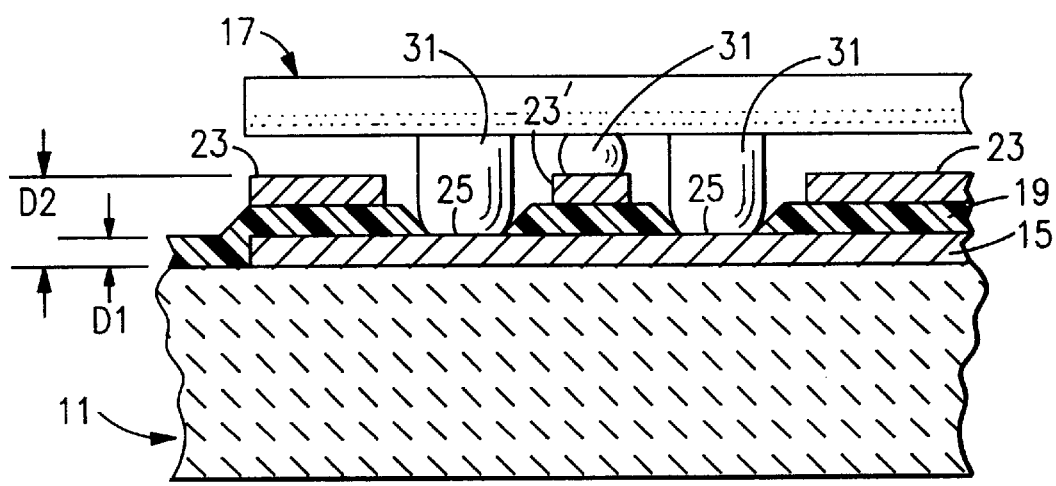
FIG. 6 illustrates the circuitized substrate as produced in accordance with the steps above, having an electronic device (semiconductor chip) positioned thereon and electrically coupled to the substrate.

With second layer 21 in place, a series of photolithography steps are performed, preferably similar to those used to form the first pattern on layer 15 (assuming such a pattern is formed and not a solid layer as shown in FIGS. 1–3). During this phase, photoresist is applied (blanket coated) onto the metal layer 21, following which a first bake occurs, following which exposure and develop steps are performed. As a subsequent bake operation then occurs. These steps are preferably similar to those currently known in the industry for circuitization of substrates such as those of ceramic and FR4 materials, and further description is not believed necessary. Equipment known in the industry may also be used, indicating yet another example of how the present invention represents a cost (and time) savings. The result is a pattern of individual conductive elements 23, e.g., lines, pads, etc. The pattern, like the first of layer 15, will also include at least one and preferably many, e g., 700, contact locations (referred to in the drawing with the numeral 23') which, like the contact locations in first layer 15, are specifically designed to be electrically coupled to respective contact sites on chip 17 (FIG. 6). In one example, contact locations 23' possessed a substantially cylindrical configuration with a diameter of only about 100 $\mu$m, this location also having a total thickness of only about 8.0 $\mu$m. Significantly, both layers 15 and 23, if of the aforementioned chromium-copper-chromium (Cr—Cu—Cr) material, still include the top sublayer of protective chromium. That is, this top 25 sublayer has not been removed from the first layer 15 during the foregoing processing, including prior to the addition of polyimide 19. Thus, each layer 15 and 21 (elements 23 and 23') is comprised, in a preferred embodiment of the invention, of Cr—Cu—Cr. In the case of layer 15, however, the overall thickness at this stage may be somewhat less than that of layer 21, due to possible different utilization of these layers. For example, a thinner layer 15 may be desired if this layer is to serve as a ground or power layer, whereas a thicker layer 21 is possible if layer 21 is to function as a signal layer. Regardless, the invention is versatile enough to permit varying thicknesses for these layers. In one embodiment, contact location 23' was spaced a distance of only about 35 $\mu$m from the nearest adjacent element 23, indicating once again the high density attainable for the conductive circuitry of the invention.

Figure 4:
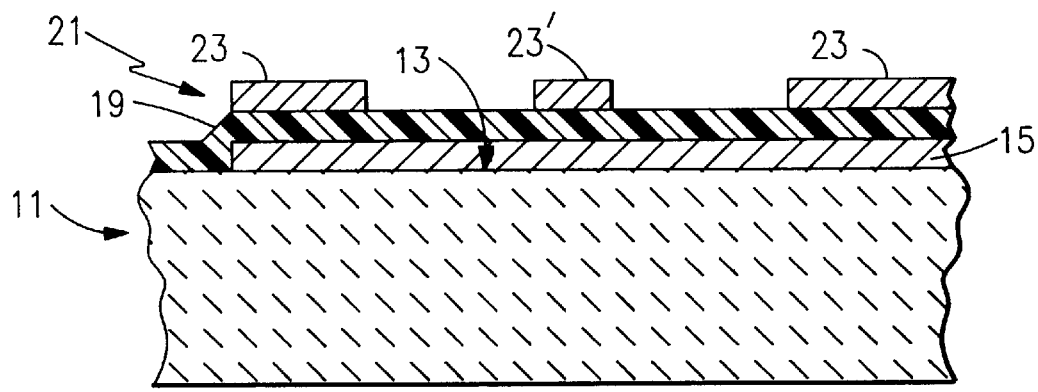

In the embodiment of FIG. 4, it is understood that any remaining photoresist (including residue) has been removed, leaving the structure substantially as shown in FIG. 4.

Figure 5:
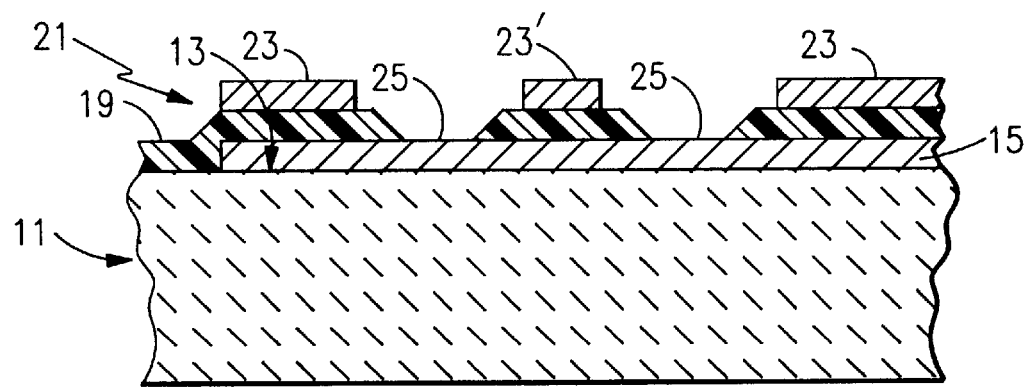

In the next step of the invention, as shown in FIG. 5, selected portions of polyimide 19 are removed, leaving a series of exposed underlying segments on first layer 15. Significantly, exposed segments 25 are to serve as the desired contact locations for layer 15, to thereby couple layer 15 to the respective, chosen contact sites on chip 17. In one embodiment, a total of 300 such exposed segments were provided, typically spaced apart from one another a distance of only about 230 $\mu$m. Considering the spacings of the above located segments 23 and 23', the overall distance from one such segment (23 or 23') from the nearest underlying exposed segment 25 is only about 35 $\mu$m. In one example, each of the exposed segments was also of substantially annular configuration and included a diameter of only about 100 $\mu$m.

The preferred method for removing the designated portions of polyimide to thereby expose segments 25 on layer 15 is to use laser ablation. In this process, an excimer laser may be used, the laser also capable of being used with as associated mask (e.g., dielectric) to ablate the desired connection sites. The preferred equipment used to perform this process is a known industrial laser, coupled to beam shaping optics. The laser ablation process was accomplished in only about 10 to 15 seconds, leaving the aforementioned total of exposed segments 25. Significantly, the underlying metal of layer 15 serves to protect the substrate during this process a particularly significant feature if a polymer or other more heat sensitive material is used.

Significantly, the respective upper surfaces of exposed segments 25 and top segment 23' are established at two different levels above surface 13. In one embodiment, segments 25 were established at a distance (D1) of only about 4.0 $\mu$m, while the above segments 23' were each established at a distance (D2) of about 20 $\mu$m, or approximately five times the distance of the closer segments. This represents a very important feature of the invention, because, as understood, both of these segments (contact locations) are adapted for directly connecting to the respective chip contact sites, e.g., through a suitable conductive solder or the like material. The lack of a metal to metal interface (e.g., copper to copper or chrome) as would occur should layer 21 be applied in direct contact with layer 15 as opposed to the unique structure made according to the process of the invention, overcomes the potentially adverse consequences mentioned hereinabove, e.g., inconsistent current resistances thereacross which in turn mandates relatively excessive testing and possible corrective actions if at all possible.

Following the above step, it is desired to remove the top layer of chromium (assuming that Cr—Cu—Cr is used) from both of the layers 15 and 21 (that is, only the exposed segments thereof). Thus, in the embodiment of FIG. 5, the upper surfaces of segments 23', as well as the exposed segments 25 of underlying layer 15, are treated. Segments 23 may not be so treated by providing protection (e.g., photoresist) thereon. The preferred method for accomplishing such removal is etching, a known process in the field. The result is that the selected exposed surfaces are comprised of copper, the chromium having been removed.

In FIG. 6, semiconductor chip 17 is positioned above substrate 11 and, using a plurality of solder elements 31, is directly electrically connected to exposed segments 23' and 25. A preferred method for accomplishing this is the aforementioned C-4 solder process developed and utilized extensively by the assignee of this invention. Other bonding processes are also possible and the invention is not meant to be limited to this particular process. The preferred solder is 3 percent tin (Sn) and 97 percent lead (Pb), designated in the industry as 3:97 Sn:Pb solder. Each solder element 31 is initially deposited on a respective contact site (conductor), not shown, located on the undersurface of chip 17. Such conductor sites are well known in the semiconductor industry and further description is not believed necessary. In a preferred embodiment, equal size solder amounts (e.g., 6 $\mu$grams) are used for each of the segments 23' and 25, thereby illustrating ready adaptability of the invention to utilization of currently known chip-solder combinations (such combinations typically utilizing identical solder amounts per chip contact site).

In a preferred method, each solder element is attached (soldered) to the respective chip site using well known industry methods (solder bumping). The chip is then inverted and aligned, e.g., using television camera and related precision equipment, relative to substrate 11, particularly assuring precisioned alignment between the respective solder elements and associated exposed contact locations. Once positioned (with the solder elements engaging the respective contact locations), the substrate-chip assembly is then heated e.g., in a nitrogen reflow furnace, to a temperature of about 350 degrees C. for a time period of about 3 minutes. Solder reflow occurs and a sound electrical connection is achieved at all desired locations. Using encapsulation technology which is well documented in the industry can further enhance chip to package reliability. Specifically, encapsulant material, several types of which are known, may be dispensed about the various solder connections.

Figure 7:
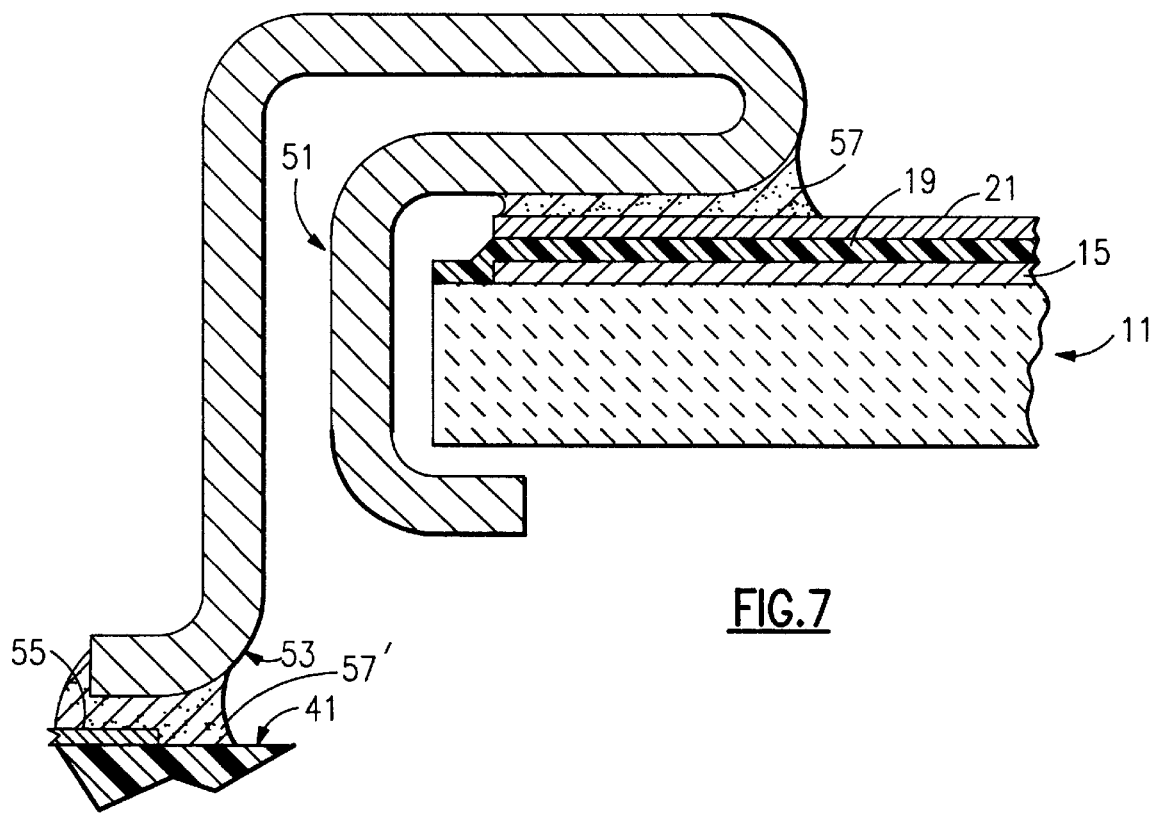
FIGS. 7 and 8 represent two embodiments of conductive clips for respectively providing electrical connection between the outermost portions of the two conductive layers on a package such as shown in FIG. 6.
Figure 8:
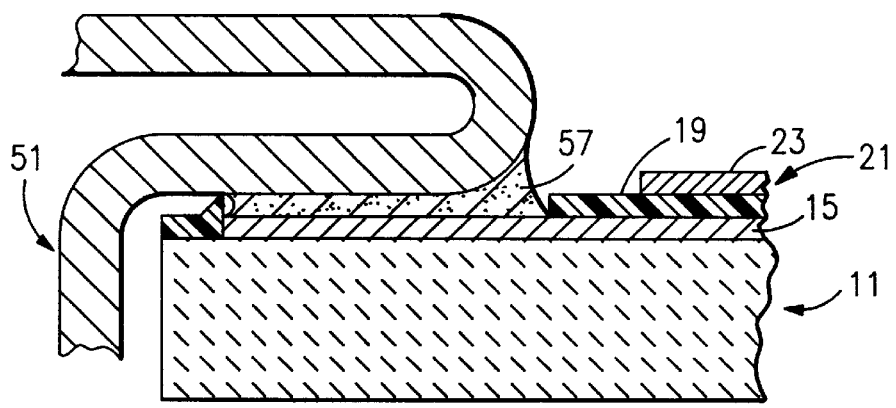

In FIGS. 7 and 8, there are depicted two different embodiments for electrically coupling selected portions of the invention's substrate to other circuitry, e.g., as found on a separate circuitized substrate 41 such as a printed circuit board (PCB) or the like. In a preferred embodiment of the invention, substrate 11, having chip 17 coupled thereto (only partially shown in FIGS. 7 and 8) to thereby form what can be referred to as a first level electronic package assembly, is then electrically coupled to such an external, additional substrate, particularly if the eventual use for the invention is within a computer. The embodiments in FIGS. 7 and 8 represent relatively simple yet effective means for accomplishing this purpose. It is understood, however, that the means illustrated in FIGS. 7 and 8 are not meant to limit the invention. Several other alternative approaches, including, e.g., solder ball attach, conductive pins, wirebonding, etc., can be successfully used.

In FIG. 7, a clip 51, e.g., stainless steel or copper, is shown as being soldered directly to the upper layer 21 at the outer peripheral portion thereof (from the internal portions depicted in FIGS. 4–6). In one embodiment, a total of 376 such clips may be used, and the invention is not meant to be limited to use of only one as shown herein. Each clip is curved in shape, as shown, and preferably has a thickness of only about 0.2 millimeters (mm). The lower part (53) thereof is designed for being positioned on and directly connected (e.g., using solder 57') to a pad or similar conductor 55 on PCB 41. In FIG. 7, clip is soldered (using solder 57) only to upper layer 21, also at the outer peripheral portion thereof. In one embodiment, 10:90 Sn:Pb solder was used for this purpose. The solder is preferably initially applied to the clip following which direct engagement between the lead attach site and solder occurs. Reflow is then accomplished by placement of the clip-substrate in an oven (as described above) at a temperature of about 350 degrees C. for about 3 minutes. The preferred method of clip 51 and chip 17 attachment is to use a simultaneous reflow of both solders 31 (between the chip and locations 23' and 25) and 57. As clearly seen in drawing FIGS. 3–8, conductive layer 15 is separated from conductive layer 21 by the dielectric layer 19 (as mentioned hereinabove, layer 19 was provided as a blanket coating onto first layer 15, and then cured). That is, layer 15 is not shown anywhere in the drawings or described in the foregoing description as being directly connected (in physical contact with) the lower conductive layer 21. Not being in direct contact, layer 15 is shown as not being directly electrically coupled to layer 21.

In the embodiment of FIG. 8, clip 51 is soldered to the first (e.g., ground) layer 15 of the substrate instead of to layer 21. This is achieved following selective removal of part of the covering polyimide 19 to thereby expose a part of layer 15 thereunder. This step (removal) is preferably accomplished simultaneously with the removal of polyimide 19 that resulted in the exposure of segments 25. Laser ablation is preferred for this step.

Thus, there has been shown and described a new circuitized substrate and a method for making same wherein effective electrical coupling between the substrate's contact locations, located on at least two different levels, is attained. The invention's teachings are readily applicable to use of additional conductive layers and the invention is thus not to be limited to the use of only two such layers as described herein. The method taught herein is capable of being performed with a maximum utilization of processing equipment, and can be performed with less steps and in less time than many known methods of the prior art, including that described earlier herein. The invention thus represents a cost savings to the package purchaser.

While there have been shown and described what are at present considered the preferred embodiments of the invention, it will be obvious to those skilled in the art that various changes and modifications can be made therein without departing from the scope of the invention as defined by the appended claims.

What is claimed is:

1. In a method of making a multilevel electronic package comprising the sequential steps of
   a) applying a first conductive layer on to a surface of a substrate the conductive layer having a top surf;
   b) applying a layer of a dielectric over the exposed top surface of the first conductive layer, and curing the dielectric layer,
   c) prior to removing any of the dielectric layer, forming a second conductive layer at a greater distance from the surface of the substrate than the first conductive layer, said second conducive layer formed on the cured dielectric layer,
   d) removing at least one portion of the second conductive layer to expose the dielectric layer immediately therebeneath;
   e) removing at leas a portion of the exposed dielectric layer to expose a portion of the first conductive layer,
   f) forming one or more solder connections on the exposed portion of the first conductive layer;
   g) forming one or more solder connections on the exposed layer of the second conductive layer with no interconnections between the solder connections to the first layer and the solder connections to the second layer, wherein the solder connections on the first conducive layer and the solder connections on the second conductive layer are separately mated to one or more additional electronic subassemblies.

2. The method according to claim 1 wherein the substrate is selected from the group consisting of ceramic, alumina and fiberglass reinforced epoxy.

3. The method according to claim 1 wherein the first and second conductive layers are sandwich layers.

4. The method according to claim 3 wherein each of the first and second conductive layers is a sandwich layer of Cr—Cu—Cr.

5. The method according to claim 4 wherein the copper layer in the first conductive layer is 4 μm thick.

6. The method to claim 4 wherein the copper layer in the second conductive layer is 8 μm thick.

7. The method according to claim 3 wherein the first a second conductive layers are applied by sputter coating.

8. The method according to claim 7 wherein the exposed dielectric layer is removed by laser ablation.

9. The method according to claim 8 wherein the exposed surfaces of the conductive layers are chromium that are removed to expose the layers of copper.

10. The method according to claim 9 wherein the layers of chromium are removed by etching.

11. The method according to claim 1 wherein the dielectric layer is cured to withstand putter coating of the second conductive layer at high temperatures.

12. The method according to claim 11 wherein the dielectric layer is a polyimide layer.

13. The method according to claim 1 wherein all of the solder connections are of equal volume.

14. The method according to claim 1 wherein the solder connections are heated to reflow the solder.

15. The method according to claim 14 wherein the solder is reflowed at a temperature of 350 degrees C. in a stream of nitrogen for a period of about 3 minutes.

16. The method according to claim 1 wherein the electronic subassemblies are selected from the group consisting of semiconductor chips and metallic clips and combinations thereof.

* * * * *